United States Patent [19]

Bieneck

[11] 4,403,810
[45] Sep. 13, 1983

[54] COUPLING FOR TRIPARTITE INJECTION OR COMPRESSION MOLD

[75] Inventor: Gunther Bieneck, Langgöns, Fed. Rep. of Germany

[73] Assignee: Hasco-Normalien Hasenclever & Co., Lüdenscheid, Fed. Rep. of Germany

[21] Appl. No.: 299,644

[22] Filed: Sep. 4, 1981

Related U.S. Application Data

[63] Continuation-in-part of Ser. No. 223,839, Jan. 9, 1981, abandoned.

[30] Foreign Application Priority Data

Jan. 11, 1980 [DE] Fed. Rep. of Germany ....... 3000798

[51] Int. Cl.³ .......................... B29F 1/00; B29C 1/16
[52] U.S. Cl. ..................................... 425/589; 249/63; 425/595; 425/451.9; 425/DIG. 221
[58] Field of Search ................. 425/589, 451.5, 451.9, 425/450.1, 595, DIG. 221; 249/63

[56] References Cited

U.S. PATENT DOCUMENTS

| 2,319,479 | 5/1943 | Ryder | 425/451.9 |
|---|---|---|---|
| 2,984,176 | 5/1961 | Sommer et al. | 425/451.9 X |
| 3,241,187 | 3/1966 | Nouel | 425/451.5 |
| 3,241,827 | 3/1966 | Nouel | 425/451.9 X |
| 3,310,842 | 3/1967 | Fischbach | 425/595 X |
| 3,348,267 | 10/1967 | Nouel | 425/451.9 X |
| 3,706,116 | 12/1972 | Drazick | 425/450.1 X |
| 3,724,802 | 4/1973 | Veneria | 425/589 X |
| 4,174,939 | 11/1979 | Fenner | 425/451.9 |

FOREIGN PATENT DOCUMENTS

| 2102725 | 8/1972 | Fed. Rep. of Germany | 425/450.1 |
|---|---|---|---|
| 2143132 | 3/1973 | Fed. Rep. of Germany | 425/451.9 |
| 2067458 | 7/1981 | United Kingdom | 425/595 |

Primary Examiner—Philip E. Anderson
Attorney, Agent, or Firm—Karl F. Ross

[57] ABSTRACT

A tripartite mold has a control bar on a fist outer plate and a locking bar parallel thereto on a second outer plate, both of them traversing respective passages in a guide block on an intermediate plate when the mold is closed. A U-shaped detent, slidable transversely to the two bars in a channel of the guide block, straddles the locking bar with clearance and is urged by spring pressure against the control bar which, in the closed position, it contacts with one leg while its other leg engages in a notch on the locking bar so as to latch the intermediate plate to the second outer plate. When the outer plates are driven apart with initial entrainment of the intermediate plate by the second outer plate, a cam on the control bar represses the detent against its spring force and disengages the other leg thereof from the locking bar whereby further separation of the outer plates lets the intermediate plate stay put while the second outer plate moves away.

6 Claims, 6 Drawing Figures

COUPLING FOR TRIPARTITE INJECTION OR COMPRESSION MOLD

CROSS-REFERENCE TO RELATED APPLICATION

This is a continuation-in-part of my copending application Ser. No. 223,839 filed Jan. 9, 1981 and abandoned concurrently with the filing of this application.

FIELD OF THE INVENTION

My present invention relates to a tripartite injection or compression mold, especially as used for the forming of plastic workpieces, and more particularly to a coupling designed to enable two-stage separation of its components (referred to hereinafter as plates) to facilitate the ejection of one or more workpieces formed in a mold-closed position.

BACKGROUND OF THE INVENTION

It is known, e.g. from U.S. Pat. No. 3,706,116, to provide the plates of such a tripartite mold with a coupling including a control bar rigid with a stationary first outer plate, a locking bar rigid with a movable second outer plate, and a detent on an intermediate plate sandwiched between the two outer plates which latches the locking bar to the intermediate plate in the mold-closed position. When the two outer plates are driven apart to open the mold, the intermediate plate is entrained by the second outer plate in a direction away from the first outer plate so as to open a first interplate gap. After that gap has reached a certain width, the control bar rigid with the first outer plate coacts with the detent on the intermediate plate to release it from the locking bar while the intermediate plate is stopped or indexed in the position last reached. The second outer plate, continuing its displacement away from the first one, then separates from the intermediate plate to open a second interplate gap. In many instances, the freshly molded workpieces are ejected into this second gap while the first one is used to prepare for such ejection by the withdrawal of one or more cores from respective mold cavities.

In the known two-stage mold coupling, the two bars pass at different levels through a guide groove accommodating the detent in a block fastened to the intermediate plate. The detent is a pivoted latch in the shape of a segment of a circle having a control lug and a locking lug respectively coacting with the corresponding bars. In the mold-closed position, a spring urges the locking lug into a triangular recess of the locking bar under sufficient pressure to hold that bar engaged. When the outer plates have begun their separation, a generally gable-shaped camming formation on the control bar bears upon the control lug of the detent and represses same against its spring force with resulting disengagement of the locking lug from the other bar.

A drawback of the known coupling is the need for a considerable spring force to keep the intermediate plate locked to the second outer plate whereby a commensurate force is required for releasing these two plates from each other. On the other hand, the camming edge of the control bar makes only line contact with the control lug of the detent so as to give rise to considerable Hertzian stresses which in turn result in rapid wear of the parts involved.

OBJECT OF THE INVENTION

The object of my invention, therefore, is to provide an improved coupling of the general type described above which is less wear-prone than the known device and operates with relatively small spring and camming forces.

SUMMARY OF THE INVENTION

I realize this object, in accordance with the present improvement, by the provision of guide means on the intermediate plate forming a track traversed by the control and locking bars in the mold-closed position, this track being parallel to the contact surfaces of the mold plates and thus perpendicular to the bars and to the direction of plate motion. Slidable along this track is a detent which has a transverse face confronting the first outer plate and a beveled face confronting the second outer plate, the control bar having a camming face paralleling this beveled face while the locking bar has a retaining face paralleling the transverse face of the detent. In the mold-closed position the retaining face of the locking bar is coplanar with the transverse face of the detent which is urged by spring means into a latching engagement of these two faces. At the same time, the control bar extends past the detent with its camming face spaced from the beveled face of the detent by a certain distance in the direction of the second outer plate. Upon a relative displacement of the two outer plates away from each other, with entrainment of the intermediate plate by the second outer plate to which it is locked, the camming face of the control bar represses the detent through the beveled face thereof against the biasing force of its spring means with resulting disengagement of the detent from the locking bar and separation of the intermediate plate from the second outer plate upon further relative displacement of the two outer plates. The coacting transverse faces of the locking bar and of the detent establish a positive interlock independent of the spring force which is needed only to move the detent into its latching position during the reclosure of the mold. Moreover, the parallelism between the coacting faces of the detent and the control bar insures an area contact between these faces during repression of the detent against the relatively weak spring force so as to minimize the Hertzian stresses and the rate of wear.

Advantageously, pursuant to a more particular feature of my invention, the dentent is a generally U-shaped member which straddles the locking bar with one leg forming its beveled face and another leg forming its transverse face.

BRIEF DESCRIPTION OF THE DRAWING

The above and other features of my invention will now be described in detail with reference to the accompanying drawing in which.

SPECIFIC DESCRIPTION

Figure 1:
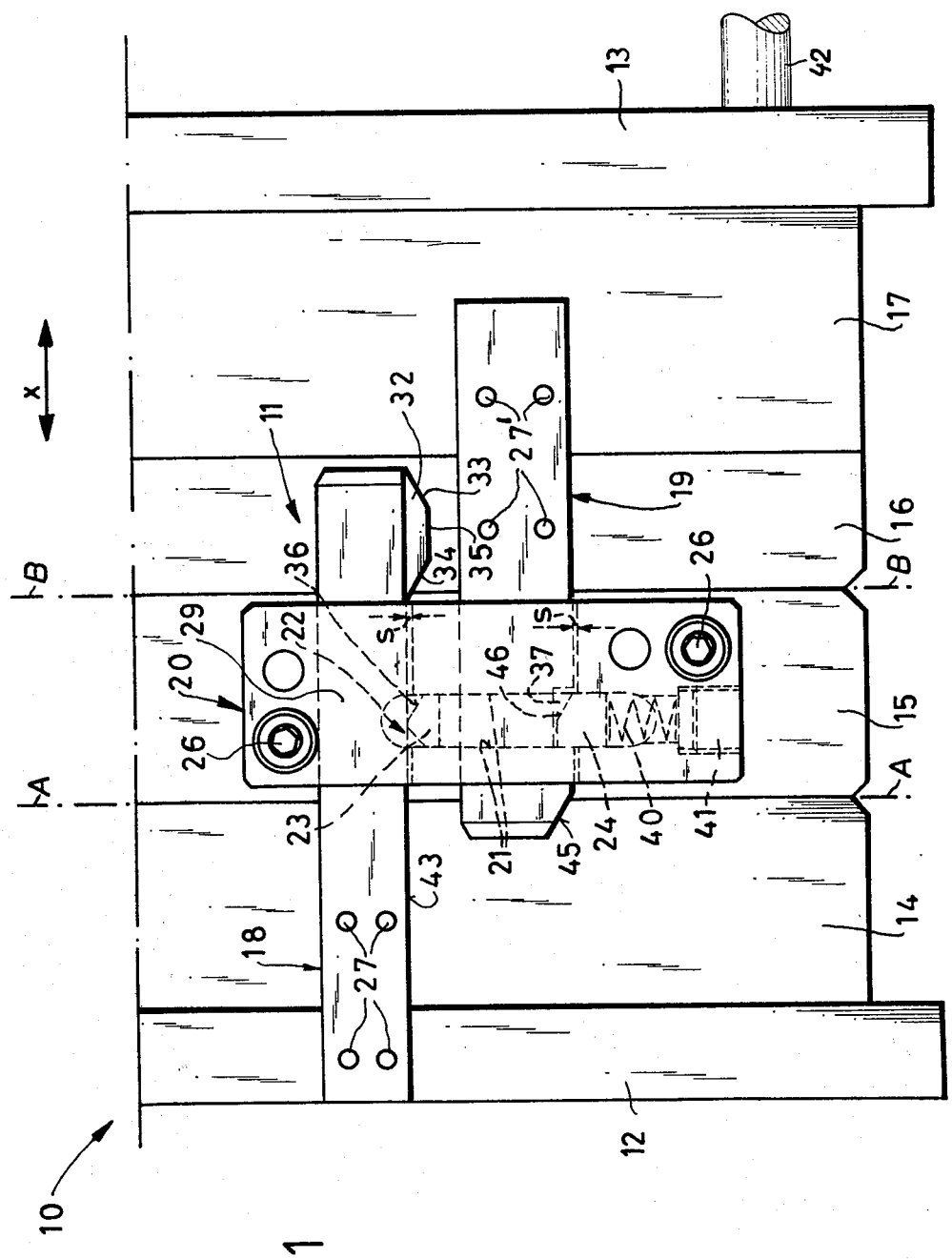
FIG. 1 is a plan view of one half of a tripartite mold, shown in closed position, which is provided with a coupling according to my invention.

In FIGS. 1–4 I have shown one half of a three-plate mold 10 whose other half, symmetrical to the one seen there, has not been illustrated. This mold half is provided with a two-stage coupling, generally designated 11, which may be symmetrically duplicated on the nonillustrated other half.

The mold 10 is here assumed to be part of an injection-molding machine, not further illustrated, including a fixed platen 12 and a movable platen 13 interconnected by the usual tie rods 42. Platen 12 carries a stationary first outer mold plate 14; a removable second outer mold plate 16 is attached to platen 13 through the intermediary of a backing plate 17. Sandwiched between the two plates 14 and 16 is an intermediate plate 15 which, like platen 13 and plates 16, 17, is slidable on the tie rods 42. The machine further includes conventional means, not shown, for injecting liquefied plastic material via platen 12 and plate 14 into one or more mold cavities defined by plates 15 and 16 in the mold-closed position of FIG. 1. Cores 50 (only one shown) on plate 14 project into these cavities in that position and are withdrawn therefrom when the mold is opened along a first parting line A—A, i.e. upon a separation of plates 14 and 15; this first-stage separation is shown in FIG. 2. In a second stage of the mold-opening storke, illustrated in FIG. 3, plates 15 and 16 also separate as platen 13 is moved farther away from platen 12 by the usual clamp drive; this opens another gap along a parting line B—B for the ejection of the molded workpieces, e.g. with the aid of stationary rods projecting into the cavity portions of plate 16.

Coupling 11, which enables this two-stage separation, comprises a control bar 18 fastened by screws 27 to platen 12 and plate 14, a locking bar 19 fastened by screws 27' to plates 16 and 17, and a guide block 20 secured by screws 26 via a base plate 28 (best seen in FIG. 5) to the intermediate plate 15. Block 20 is essentially a prismatic housing of rectangular outline with major sides perpendicular to the direction x of plate motion; it is formed by a roof 29 integral with end walls 30, 31 and side walls 48, 49. These side walls, which are of identical shape except for their thickness, form two passages in line with bars 18 and 19 which both traverse the block 20 in the position of FIG. 1.

Figure 5:
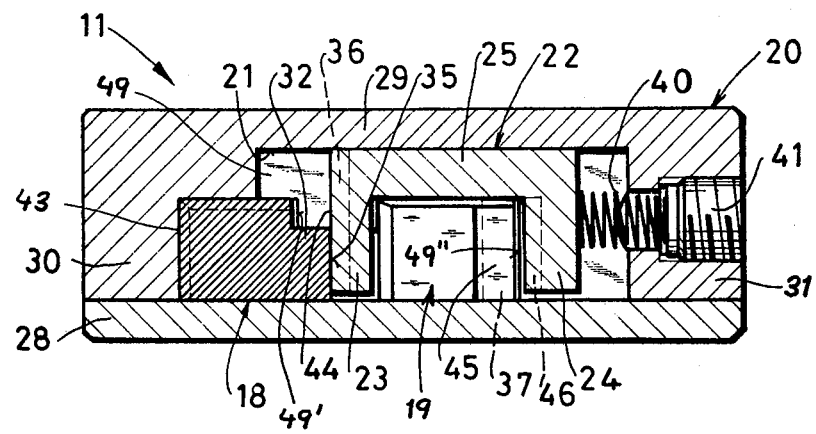
FIG. 5 is a cross-sectional view of a guide block, taken on the line V—V of FIG. 3.

It will be noted from FIG. 5 that bars 18 and 19 are disposed on the same level, being slidable on the plate 28 of block 20.

Figure 6:
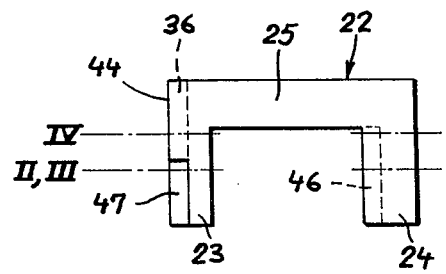
FIG. 6 is an elevational view of a detent member slidable in the guide block of FIG. 5.

Side walls 48 and 49 define between them a transverse channel 21 which is intersected by the passages for the bars and serves as a track for a detent 22; the latter, as best seen in FIGS. 5 and 6, is a substantially U-shaped member straddling the path of bar 19 with legs 23, 24 of angular cross-section which are interconnected by a web 25. A compression spring 40 in a bore of end wall 31, held in position by a screw 41, bears upon the leg 24 to urge the detent 22 toward the path of control bar 18. The bar 18 has a trapezoidal projection 32 with camming faces 33, 34 interconnected by a side face 35, the latter extending parallel to a longitudinal edge 43 of bar 18 in the direction x of plate motion; faces 33 and 34 are inclined to that direction at an acute angle, preferably of slightly less than 45°. Leg 23 of detent 22 has a beveled face 36 parallel to camming face 34 but separated therefrom in the position of FIG. 1. Another beveled face 47 of leg 23 parallels the camming face 33 of projection 32; as will be noted from FIGS. 2–4, faces 36 and 47 do not converge in a common edge but are separated by a flat zone 44' so that the leg profile defined by them is trapezoidal rather than triangular. Face 47, in fact, will be needed only under certain circumstances (described hereinafter with reference to FIG. 4) and could be omitted so that zone 44' is replaced by a downward extension of a flat land 44 of about half the width of leg 23 located in FIG. 6 above face 47.

Locking bar 19 has a notch 37 bounded by transverse shoulders 38 and 38' paralleling faces 39 and 39' of leg 24; of these, however, only faces 38 and 39 are essential for the operation of coupling 11. Bar 19 further has a camming face 45 which upon its withdrawal from guide block 20, i.e. in the mold-open position of FIG. 3, confronts a beveled face 46 on leg 24 of detent 22. Again, the two parallel faces 45 and 46 interact only under extraodinary conditions as described hereinafter. Further bevels at the free ends of bars 18 and 19 facilitate their insertion into the corresponding passages of block 20 and, in the case of bar 19, also prevent any obstruction thereof by the detent 22 which as shown in FIG. 5 has a certain vertical mobility in its channel 21 when the bar 19 is withdrawn therefrom. It will also be noted that vertical edges 49' and 49" of side wall 49 are separated by clearances s (FIG. 1) from the longitudinal edge 43 of bar 18 and from the corresponding edge of bar 19, respectively, to simplify the assembly. The lateral play provided by these clearances is, of course, less than the width of shoulder 38 which is positively engaged by detent face 39 in the locking position of FIGS. 1 and 2.

Figure 2:
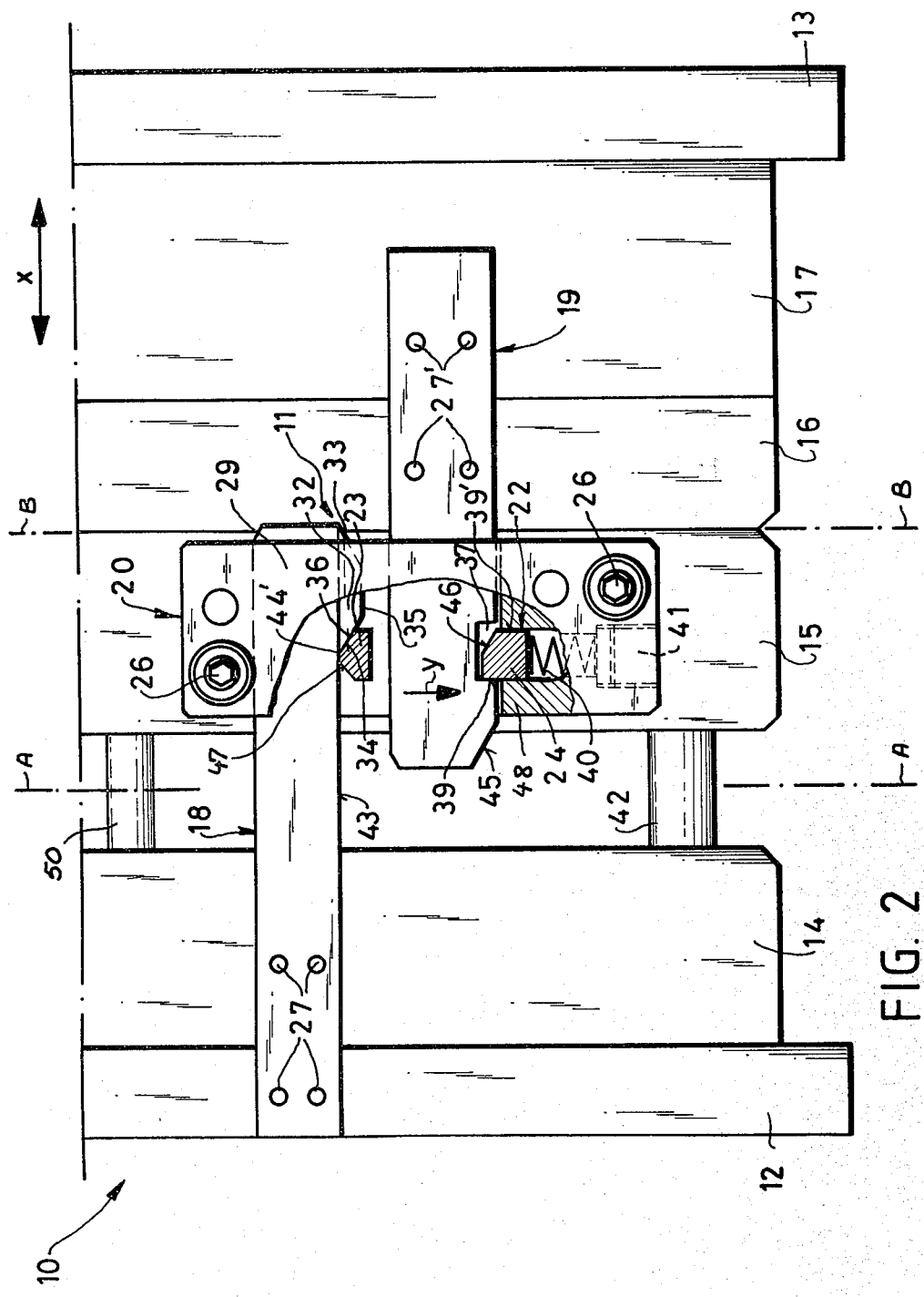
FIGS. 2, 3 and 4 are views similar to that of FIG. 1 but with parts broken away (on levels designated II, III, IV in FIG. 6), showing the mold in different stages of separation of its plates.
Figure 3:
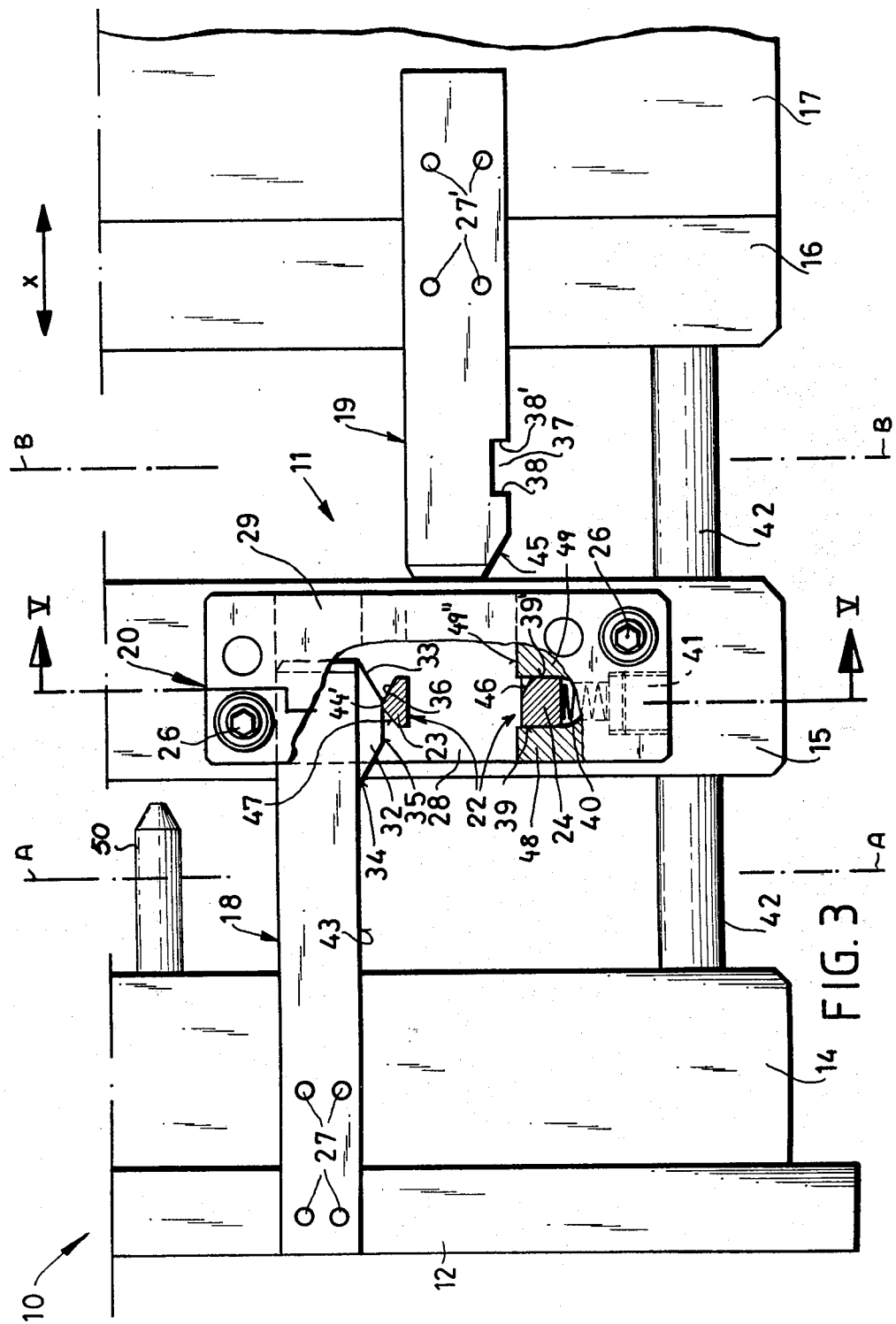

In the mold-closed position of FIG. 1, with camming projection 32 offset from detent 22, spring 40 holds the leg 24 is notch 37 of bar 19 whereby the two coplanar faces 38 and 39 positively interlock to hold the plates 15 and 16 together at their contact surfaces along parting line B—B. The contact surfaces of plates 14 and 15, along parting line A—A, are also closely juxtaposed under the clamping pressure of the mold drive while one or more workpieces are formed in mold 10. Thereafter, platen 13 is moved to the right and, with locking bar 19 still engaged by detent 22, entrains the plate 15 in the same direction until camming face 34 engages the beveled face 36 of detent leg 23 as shown in FIG. 2. This camming edge depresses the detent against the force of spring 40 so as to disengage its leg 24 from notch 37 of bar 19 whereby plate 15 is released from plate 16. As the platen 13 with plates 16 and 17 continues its rightward motion, plate 15 stays put in the position of FIG. 3 in which it is held by a nonillustrated stop so that the gap between plates 15 and 16 widens sufficiently for the ejection of the molded workpieces. At this point the side face 35 of projection 32 is in area contact with the flat land 44' lying between the beveled faces 36 and 37 of leg 23.

On the subsequent mold-closing stroke, platen 13 moves to the left whereby bar 19 enters the block 20, its notch 37 being aligned with detent leg 24 as soon as plate 16 contacts plate 15 along parting line B—B. Plate 15, pushed by plate 16, then moves out of the position of FIG. 3 into that of FIG. 2 in which projection 32 disengages the leg 23 so that spring 40 is able to restore the latching position of detent 22 and locking bar 19. With the wider land 44 of leg 23 sliding along edge 43 of bar 18, further displacement of platen 13 in the second stage of the mold-closing stroke re-establishes the position of FIG. 1.

Figure 4:
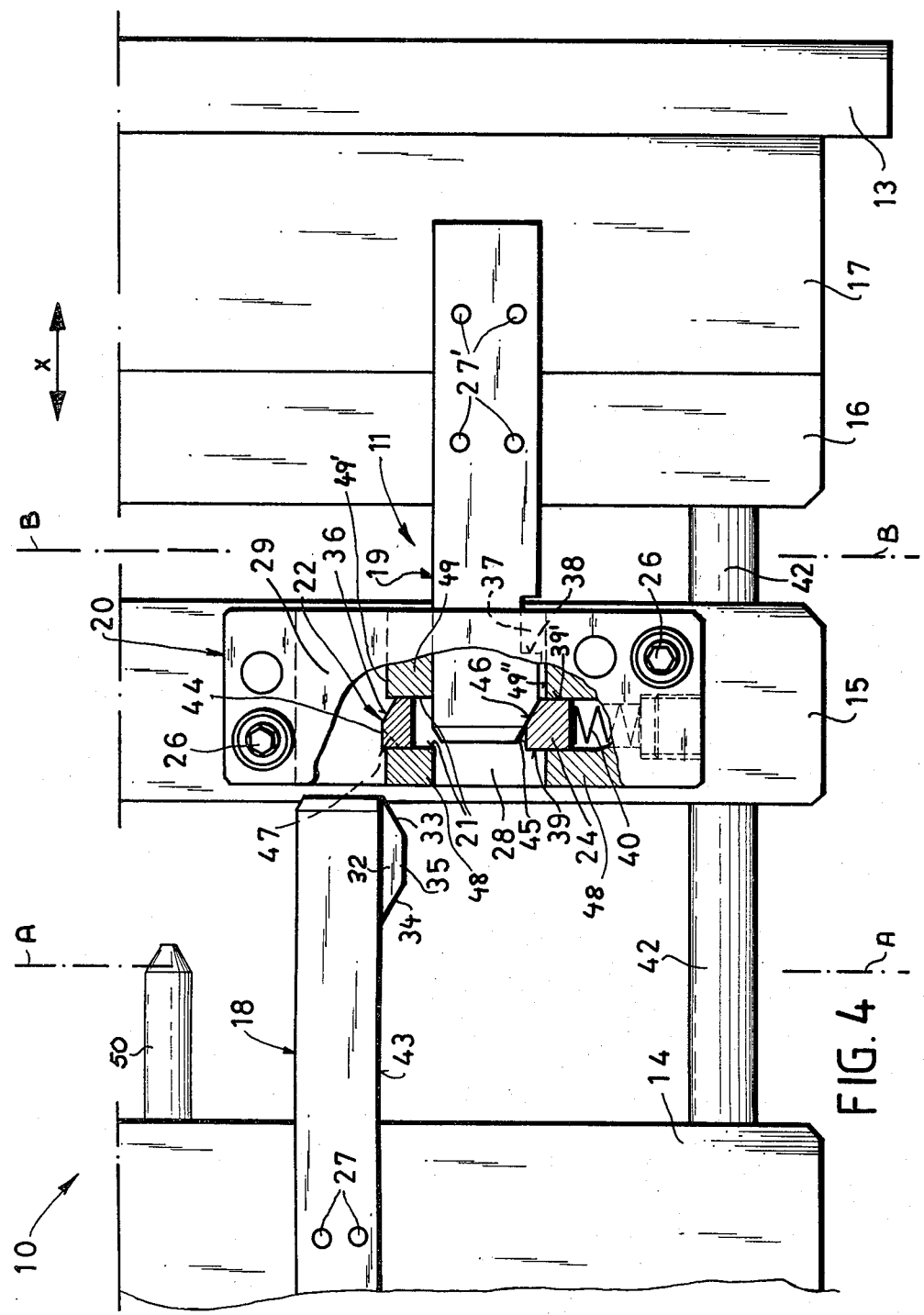

For servicing or inspection it may be necessary to widen the gap between plates 14 and 15 so that, as shown in FIG. 4, control bar 18 is withdrawn from block 20. The coaction of beveled faces 33 and 47 then enables this bar to be reinserted into the block even if beveled faces 45, 46 of bar 19 and leg 24 have not repressed the detent 22, as where the plate 15 is pushed manually toward the plate 14.

It will be apparent that the bars 18, 19 and block 20 of coupling 11 need not be mounted on horizontal surfaces of the respective mold plates, as shown, but could be carried instead on their vertical sides. Also, the staggered separation of plate 15 from plates 14 and 16 may be used for a two-stage ejection process not necessarily involving the withdrawal of cores.

I claim:

1. In a tripartite mold comprising a first outer plate, a second outer plate and an intermediate plate sandwiched between said outer plates, said plates having contact surfaces perpendicular to a direction of relative motion, the combination therewith of coupling means for enabling two-stage separation of said plates from one another after the molding of a workpiece in a mold-closed position in which said plates are in mutual contact, said coupling means comprising:

a control bar rigid with said first outer plate extending transversely to said contact surfaces toward said second outer plate;

a locking bar rigid with said second outer plate extending parallel to said control bar toward said first outer plate;

a transverse guide block on said intermediate plate with a channel forming a track parallel to said contact surfaces, said channel intersecting two parallel passages in said guide block that are traversed by said bars with limited lateral play in said mold-closed position;

a generally U-shaped detent member slidable in said channel transversely to said direction of motion, said detent member having a first and a second leg straddling said locking bar, said first leg being provided with a beveled face confronting said second outer plate, said control bar having a camming face paralleling said beveled face, said second leg having an angular cross-section and being positively engageable by a transverse shoulder of said locking bar whose width exceeds said play and which faces away from said first outer plate, said shoulder being coplanar with a transverse face of said second leg in said mold-closed position, said control bar extending past said detent member in said mold-closed position with said camming face spaced from said beveled face by a certain distance in the direction of said second outer plate; and spring means effective in said mold-closed position to urge said detent member into latching engagement of said transverse face with said shoulder for preventing separation of said intermediate plate from said second outer plate, with said beveled face lying in the path of said camming face whereby relative displacement of said outer plates away from each other by said certain distance causes said camming face to repress said detent member through said beveled face against the force of said spring means with resulting disengagement of said second leg from said locking bar and separation of said intermediate plate from said second outer plate upon further relative displacement of said outer plates.

2. The combination defined in claim 1 wherein said spring means comprises a compression spring in said guide block bearing upon said second leg.

3. The combination defined in claim 1 or 2 wherein said control bar is provided with a lateral projection forming said camming face, said locking bar being provided with a lateral notch bounded by said shoulder.

4. The combination defined in claim 3 wherein said projection has an oppositely inclined second camming face confronting a second beveled face parallel thereto on said first leg for facilitating reinsertion of said control bar into said guide block after withdrawal from the corresponding passage thereof, said locking bar being provided with a further camming face confronting a further beveled face on said second leg for enabling repression of said detent member against the force of said spring means upon a reapproach of said intermediate plate by said second outer plate.

5. The combination defined in claim 3 wherein said projection has a side face contacting a flat land of said first leg in a position of normal separation of said intermediate plate from said first outer plate for holding said detent member repressed.

6. The combination defined in claim 1 or 2 wherein said bars are slidable on a base plate of said guide block.

* * * * *